United States Patent

Ishii et al.

[11] 4,013,534
[45] Mar. 22, 1977

[54] METHOD OF MAKING A MAGNETIC OXIDE FILM

[75] Inventors: Yoshikazu Ishii, Mito; Seizi Hattori, Tomobe; Nobuo Inagaki, Katsuta, all of Japan

[73] Assignee: Nippon Telegraph and Telephone Public Corporation, Tokyo, Japan

[22] Filed: Oct. 14, 1975

[21] Appl. No.: 621,857

[30] Foreign Application Priority Data
Nov. 12, 1974 Japan .......................... 49-130208

[52] U.S. Cl. ........................ 204/192 M; 360/135
[51] Int. Cl.² .................. C23C 15/00; G11B 5/82
[58] Field of Search ................ 204/192; 360/135

[56] References Cited

UNITED STATES PATENTS 3,763,003  10/1973  Kobayashi et al. ............. 204/37 R
3,795,542  3/1974   Halaby et al. ................ 204/192 X
3,829,372  8/1974   Heller ............................ 204/192

Primary Examiner—John H. Mack
Assistant Examiner—Aaron Weisstuch

[57] ABSTRACT

In the process of sputtering of an iron target in an atmosphere composed of a mixed gas containing a rare gas and oxygen, the oxygen partial pressure is regulated prior to both presputtering and main sputtering, by which ferromagnetic oxide $Fe_3O_4$ is deposited on a substrate in one process. By setting the temperature of the substrate at 150° to 250° C, the coercive force and the squareness ratio of the oxide film is greatly enhanced. By using the oxide film as a medium of a magnetic disk storage, a magnetic recording and storage device of excellent characteristics can be obtained.

3 Claims, 4 Drawing Figures

METHOD OF MAKING A MAGNETIC OXIDE FILM

BACKGROUND OF THE INVENTION

1. Field of the Invention

This invention relates to a method of making a magnetic oxide film, and more particularly to a method of making a magnetic oxide film of excellent magnetic properties which is suitable for use in a recording medium of magnetic disks.

2. Description of the Prior Art

Conventional methods for the manufacture of a magnetic oxide film for magnetic disks include, for example, a particulate coating method, the method of making a continuous thin film by heating a film of $\alpha\text{-}Fe_2O_3$ from a solution of ferric chloride and reducing it to magnetite, a method in which a film of iron or non-magnetic $\alpha\text{-}Fe_2O_3$ formed by sputtering or the like is rendered into a ferromagnetic oxide, and the method of making alternating layers of magnetic iron and non-magnetic iron oxide (hematite $\alpha\text{-}Fe_2O_3$) on a substrate under a controlled sputtering atmosphere.

In the particulate coating method, a binding material is employed to provide for enhanced adhesiveness of oxide fine particles to the substrate and tightened binding of the fine particles to one another. This lowers the density of the magnetic oxide contained in the film ultimately obtained, and hence is not suitable for recording with very high storage density. Further, from the view-point of coating techniques, it is very difficult to form the film to a thickness of the order of $10^3 \text{Å}$.

With the abovesaid method of making a continuous thin film by heating a film of $\alpha\text{-}Fe_2O_3$ from a solution of ferric chloride and reducing it to magnetite (refer to U.S. Pat. No. 3,620,841), the thickness of the film coated at one time is small, so that a coating and drying process must be carried out a plurality of times. Hence, this method is low in working efficiency.

With the abovesaid method of forming a magnetic oxide film of $Fe_3O_4$ from a film of Fe or $\alpha\text{-}Fe_2O_3$ formed by sputtering or the like (refer to U.S. Pat. No. 3,795,542), it is necessary to oxidize Fe at 300° to 450° C to $\alpha\text{-}Fe_2O_3$ and, further, it is then necessary to reduce the $\alpha\text{-}Fe_2O_3$ to $Fe_3O_4$ in a controlled reducing atmosphere at 300° to 350° C. These operations involve the use of relatively large apparatus and, in addition, require several treatment steps. Further, since the treating temperature is above 300° C, it is difficult to use an inexpensive substrate such as aluminum alloy.

The abovesaid method of making alternating layers of magnetic iron and non-magnetic iron oxide on a substrate under a controlled sputtering atmosphere has the disadvantages requiring sophisticated high-class apparatus and a high degree of control must be exercised, for example, apparatus for controlling the oxygen pressure by repeatedly changing the blending ratio of a rare gas and oxygen in the sputtering process and a control of the absolute values of the thicknesses of iron and iron oxide for maintaining the magnetic properties of the film constant are required.

SUMMARY OF THE INVENTION

This invention is to overcome the aforesaid defects of the prior art methods and has for its object to provide a method of making a magnetic oxide thin film which is suitable for use as a recording medium of magnetic disks, which is excellent in adhesiveness to the substrate, in mechanical strength and in magnetic properties and has a thickness, for example, of the order of $10^3 \text{Å}$. Further this method requires less manufacturing steps, shorter treating time and lower treating temperature, as compared with the conventional methods described previously.

With this invention, in the sputtering process utilizing on an iron target, a ferromagnetic oxide $Fe_3O_4$ is deposited on a substrate by controlling the oxygen pressure twice, i.e. prior to pre-sputtering, and main sputtering. The control is through the use of a certain mixed gas of a rare gas and oxygen. The temperature of the substrate in the above step is held at 150° to 250° C, thereby attaining the abovesaid object.

DESCRIPTION OF THE PREFERRED EMBODIMENTS

Figure 1:
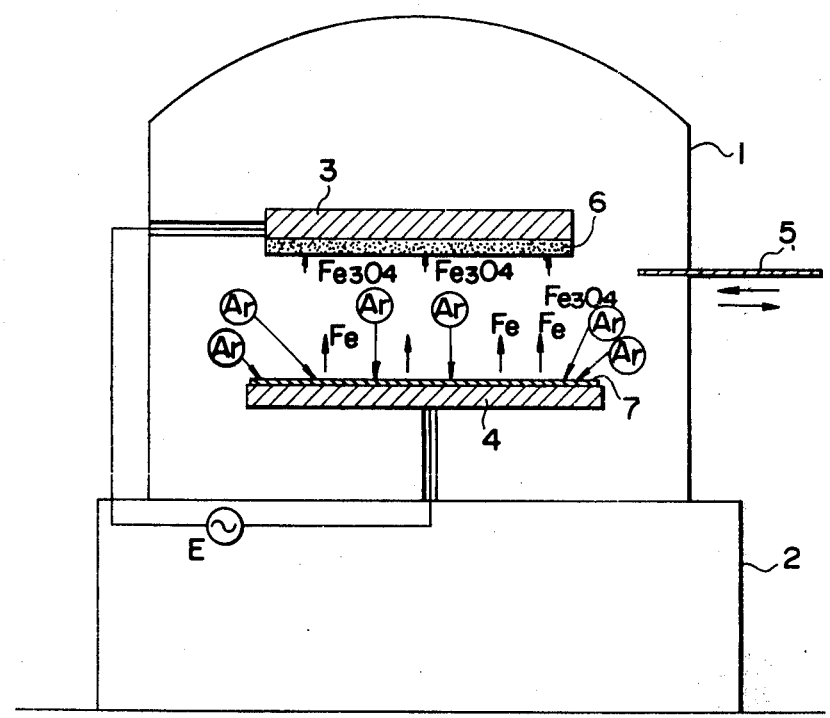
FIG. 1 is a schematic diagram showing the basic construction of sputtering apparatus for use in this invention.

FIG. 1 is a diagram for explaining the sputtering apparatus for use in this invention. In FIG. 1, reference numeral 1 indicates a jar; 2 designates a power source and control unit; 3 identifies a substrate; 4 denotes an iron target; 5 represents a shutter; 6 shows an $Fe_3O_4$ layer; and 7 refers to an oxide layer.

In the jar 1, the target electrode 4 and the substrate electrode 3 are disposed opposite to each other and a high-frequency voltage E is applied between them. After an argon-oxygen gas of a certain blending ratio is sealed in the jar 1, pre-sputtering is carried out while controlling the oxygen partial pressure.

By the bombardment of argon molecules on the iron target 4, iron is sputtered from the target 4 and combined with oxygen molecules to form the iron oxide 6, which is deposited on the surface of the substrate 3. It has been clarified theoretically that, in the above case, as the oxygen partial pressure increases, oxidation proceeds in the following order.

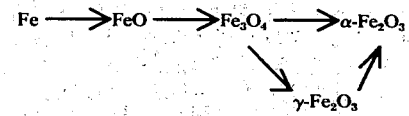

Figure 2:
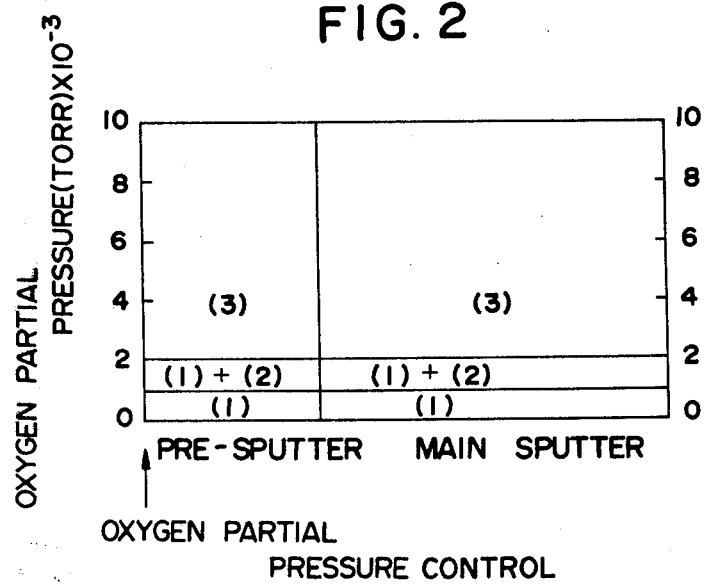
FIG. 2 shows the relationship between the oxygen partial pressure and the layers formed in the prior art.

In practice, however, it is difficult to obtain a single phase of the magnetic oxide $Fe_3O_4$. With the prior art methods, only a mixed phase of Fe and $Fe_3O_4$ is obtained momentarily. Namely, as shown in FIG. 2, in which 1, 2 and 3 indicate Fe, $Fe_3O_4$ and $\alpha\text{-}Fe_2O_3$, respectively, the oxygen partial pressure is controlled only prior to the pre-sputtering in the prior art, so that a single phase of Fe is obtained under an oxygen partial pressure of 0 to $1 \times 10^{-3}$ Torr, a mixed phase of Fe and $Fe_3O_4$ is obtained under an oxygen partial pressure of 1 to $2 \times 10^{-3}$ Torr and a single phase of $\alpha\text{-}Fe_2O_3$ is obtained under higher oxygen partial pressure. Accordingly, in the prior art, $Fe_3O_4$ is obtained by reducing the hematite phase ($\alpha$-$Fe_2O_3$) in a reducing atmosphere at a temperature of 300° to 350° C.

In the standard case of this invention, an iron target is used, an argon-oxygen gas of a certain blending ratio is employed, pre-sputtering is effected under low oxygen pressure and, then, the total pressure is increased and main sputtering is achieved under increased oxygen pressure, thereby depositing the single phase of magnetic oxide $Fe_3O_4$ on the substrate.

Figure 3:
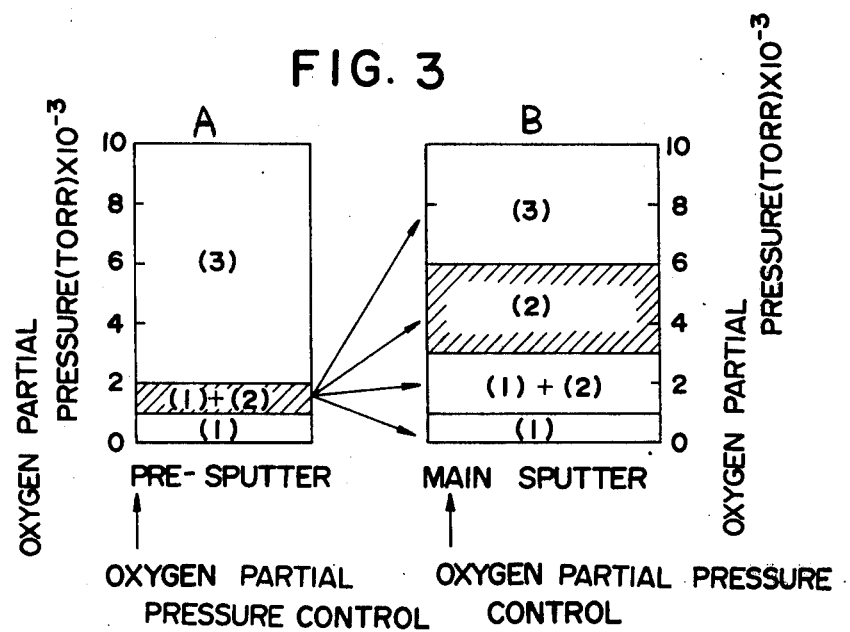
FIG. 3 shows the relationship between the oxygen partial pressure and the layers formed in this invention.

FIG. 3 shows the relationship between the oxygen partial pressure and the phase formed by sputtering.

A first step consists in the oxygen partial pressure control before pre-sputtering, which is adopted from the prior art. The oxygen pressure is maintained between 1 to 2 $\times$ $10^{-3}$ Torr and pre-sputtering is carried out. Then, the shutter of the sputtering apparatus is opened and main sputtering is achieved, by which a mixed phase of Fe and $Fe_3O_4$ is obtained as shown in FIG. 3. This step is a step characteristic of this invention, because, following the first step, the total pressure is increased and main sputtering is carried out under an oxygen pressure of 3 to 6 $\times$ $10^{-3}$ Torr, by which the single phase of the magnetic oxide $Fe_3O_4$ is obtained.

Namely, in the pre-sputtering of the first step, the shutter 5 in FIG. 1 is moved in the direction of the arrow to shield the substrate 3, thereby preventing deposition of the single phase of Fe or the mixed phased of Fe and $Fe_2O_3$ on the substrate 3. Then, in the main sputtering of the second step, the shutter 5 is returned to the position shown in FIG. 1 to permit the deposition of the magnetite phase ($Fe_3O_4$) on the substrate 3. In this case, the temperature of the substrate 3 is set in the range of 150° to 250° C.

When the iron target 4 and the substrate 3 are placed in the jar 1, the loading operation is carried out in the atmosphere, so that oxide layer 7 is formed on the surface of the target 4 owing to oxygen in the atmosphere. Thereafter, the jar 1 is evacuated and a gas of argon and oxygen is sealed in the jar 1 and the oxygen pressure is controlled to be low, after which pre-sputtering is effected. In the initial stage of the pre-sputtering, the oxide film 7 formed on the target surface is sputtered, so that a film of $\alpha$-$Fe_2O_3$ is formed. Thereafter, when the oxide film has been removed by sputtering to expose the surface of the iron target 4, there occurs a state during which there is formed a film of the mixed phase of Fe and $Fe_3O_4$. Then, the oxygen pressure is controlled by increasing the total pressure in the above sputtering state, which is the feature of this invention, and main sputtering is carried out to thereby deposit the single phase of $Fe_3O_4$ on the substrate 3. Namely, in the pre-sputtering, the oxide film 7 is removed and, in the main sputtering, the oxygen pressure is adjusted to the value suitable for the formation of the single phase of magnetite. Once the above state has been obtained, the single phase of magnetite ($Fe_3O_4$) can be obtained successively, even if the substrate 3 is replaced with new ones repeatedly.

As shown in FIG. 2, even if the oxygen pressure is merely controlled to be 3 to 6 $\times$ $10^{-3}$ Torr, the oxide layer 7 formed on the target 4 is not completely removed, so that the single phase of $Fe_3O_4$ is not ever obtained and $\alpha$-$Fe_2O_3$ is formed.

With the conventional methods, since the single phase of $Fe_3O_4$ cannot be obtained, $\alpha$-$Fe_2O_3$ is initially formed and then reduced to obtain $Fe_3O_4$. However, this reduction must be effected at high temperature (above 300° C), and hence makes it difficult to use an inexpensive substrate of aluminum alloy.

In accordance with this invention, the formation of the single phase of the magnetic oxide $Fe_3O_4$, which has been impossible in the past, is made possible by achieving an oxygen pressure control before main sputtering in addition to the oxygen pressure control before pre-sputtering which has been employed in the prior art. Further, according to this invention, since a film of the single phase of $Fe_3O_4$ can be obtained at a relatively low temperature, use of an aluminum alloy substrate is easy. Further no reducing process is required. By maintaining the temperature of the substrate 3 in the range of 150° to 250° C during the formation of the thin film 6, the coercive force and the squareness ratio are enhanced. The same results can also be obtained by annealing the film 6 at 150° to 250° C in the atmosphere.

Figure 4:
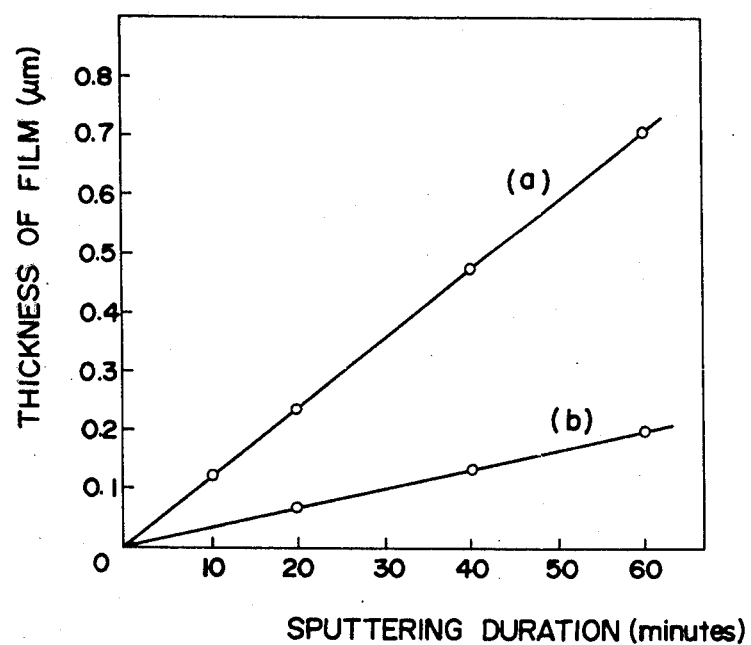
FIG. 4 is a graph showing the relationship between thickness of the $Fe_3O_4$ film formed and the sputtering time according to this invention.

FIG. 4 shows the relationship between the thickness of the $Fe_3O_4$ film formed by the method of this invention and the sputtering time. In FIG. 4, ($a$) indicates the relationship according to the method of this invention and ($b$) the relationship in the formation of $\alpha$-$Fe_2O_3$ by the prior art method. Control of the thickness of the film can be achieved only by controlling the sputtering duration, if the sputtering voltage and the sputtering atmosphere are maintained constant. For example, the formation of a film 0.2$\mu$m thick requires 20 minutes and this speed of film formation is about three times as high as that of the formation of $\alpha$-$Fe_2O_3$ by the prior art. Therefore, the method of this invention is excellent in productivity, too.

EXAMPLE I

The sputtering apparatus used was one generally placed on the market and the target used was 360mm$\phi$ and could be heated to 300° C. The substrate used was a disk substrate of aluminum alloy which was 360mm$\phi$. A mixed gas composed of 80% of argon and 20% of oxygen was used. The total pressure in the jar was 0.75 $\times$ $10^{-2}$ Torr and the oxygen partial pressure was maintained at 1.5 $\times$ $10^{-3}$ Torr. After presputtering was achieved for 15 minutes, the pressure in the jar was adjusted to 3 $\times$ $10^{-2}$ Torr and main sputtering was carried out under an oxygen pressure of 6 $\times$ $10^{-3}$ Torr for 17 minutes, by which a magnetic thin film 0.2$\mu$m thick was obtained. As a result of measurement of the magnetization of the thin film by means of a vibration sample magnetometer, it was ascertained that the saturation magnetization of the film was 5800 gauss, which was substantially equal to that 6000 gauss of the bulk $Fe_3O_4$, and that the film was the single phase of $Fe_3O_4$.

EXAMPLE II

A film 0.1$\mu$m thick was formed on a plate of rock salt by the same procedures as those employed in Example 1. As a result of observation of the film under an electronic microscope, it was ascertained that the film had a fine crystalline constitution, showed a spinel-type electronic diffraction pattern and was the single phase of $Fe_3O_4$. Additionally, examination of the heating dependency of the substrate by measurement of the magnetic properties of the magnetic thin film obtained, showed that its coercive force and squareness ratio were enhanced with an increase in the heating temperature. When the film was obtained under water-cooled condition, its coercive force and squareness ratio were 150 Oe and 0.2 to 0.3, respectively, but the coercive force and the squareness ratio of a film obtained at 200° C were 400 Oe and 0.6, respectively. The coercive force and the squareness ratio of the film obtained under water-cooled condition were enhanced to 500 Oe and 0.7, respectively, by annealing the film in air. Thus, a magnetic disk medium of excellent properties could be obtained.

EXAMPLE III

Pre-sputtering was carried out in the same manner as in Example I and the pressure in the jar was adjusted to $1.5 \times 10^{-3}$ Torr and main sputtering was achieved under an oxygen pressure of $3 \times 10^{-3}$ Torr. As a result of measurement of the saturation magnetization of the film formed, it was ascertained that the film had a saturation magnetization of 5900 gauss and the single phase of $Fe_3O_4$.

EXAMPLE IV

A mixed gas composed of 90% of argon and 10% of oxygen was used and the atmospheric pressure in the jar was adjusted to provide the same oxygen pressures as those in Examples I and III. Exactly the same results as those in Examples I and III were obtained.

As is has been described in the foregoing, in the magnetic oxide thin film manufacturing method of this invention, a magnetic film of $Fe_3O_4$ can be deposited directly on a substrate by radio frequency sputtering. This eliminates the necessity of the reduction of $\alpha$-$Fe_2O_3$ at 300° to 350° C after sputtering, such as is employed in the prior art, and greatly shortens the sputtering time. Further, since the magnetic oxide film can be manufactured at a temperature below 200° C, a substrate of aluminum alloy can also be used. This permits the use of the same aluminum alloy substrate as that now employed for $\alpha$-$Fe_2O_3$ coated magnetic disk storage. In addition, a thin film of $10^3$ A thickness and composed entirely of a magnetic medium can be obtained, so that magnetic disk storage of high recording density can be obtained easily.

It will be apparent that many modifications and variations may be effected without departing from the scope of the novel concepts of this invention.

What is claimed is:

1. A method of making a magnetic oxide film on a substrate by sputtering thereto from an iron target in an atmosphere composed of a mixed gas containing an inert gas and oxygen, with the partial pressure of the oxygen being regulated, said method comprising the steps of:

pre-sputtering the iron target in the oxygen-argon atmosphere while maintaining the oxygen partial pressure between $1 \times 10^{-3}$ and $2 \times 10^{-3}$ Torr, with a shutter being disposed between the iron target and the substrate; and sputtering from the iron target to the substrate in the oxygen-argon atmosphere while maintaining the oxygen partial pressure between $3 \times 10^{-3}$ and $6 \times 10^{-3}$ Torr, with the shutter being removed from between the iron target and the substrate, thereby depositing a magnetite thin film of single-phase $Fe_3O_4$ on the substrate.

2. The method according to claim 1 wherein said substrate is held at a temperature in the range of 150° to 250° C.

3. The method according to claim 1 which further includes the step of annealing said magnetite film in an air atmosphere, while the substrate is held at a temperature of 150° to 250° C.

* * * * *